(12) United States Patent
Choi (10) Patent No.: US 11,287,935 B2
(45) Date of Patent: Mar. 29, 2022

(54) STRETCHABLE TOUCHSCREEN, METHOD FOR MANUFACTURING THE SAME, AND DISPLAY DEVICE USING THE SAME

(71) Applicant: LG Display Co., Ltd., Seoul (KR)

(72) Inventor: Suk Choi, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 15/857,355

(22) Filed: Dec. 28, 2017

(65) Prior Publication Data

US 2018/0188851 A1 Jul. 5, 2018

(30) Foreign Application Priority Data

Dec. 30, 2016 (KR) .................. 10-2016-0184419

(51) Int. Cl.
*G06F 3/044* (2006.01)
*H05K 1/03* (2006.01)
(Continued)

(52) U.S. Cl.
CPC ............ *G06F 3/0446* (2019.05); *G06F 3/047* (2013.01); *H05K 1/0313* (2013.01); *H05K 3/0014* (2013.01); *H05K 3/28* (2013.01); *G06F 2203/04102* (2013.01); *G06F 2203/04103* (2013.01); *H05K 1/0283* (2013.01); *H05K 3/107* (2013.01); *H05K 2201/0108* (2013.01); *H05K 2201/0162* (2013.01);
(Continued)

(58) Field of Classification Search
CPC ....................................................... G06F 3/044
See application file for complete search history.

(56) References Cited

U.S. PATENT DOCUMENTS 9,501,199 B2    11/2016   Her
9,904,088 B2    2/2018   Chai et al.
(Continued)

FOREIGN PATENT DOCUMENTS

CN    105427917 A    3/2016
CN    105448423 A    3/2016
(Continued)

OTHER PUBLICATIONS

Japan Patent Office, Office Action, JP Patent Application No. 2017-253707, dated Nov. 6, 2018, 5 pages (with concise explanation of relevance).

(Continued)

*Primary Examiner* — William Boddie
*Assistant Examiner* — Andrew B Schnirel
(74) *Attorney, Agent, or Firm* — Fenwick & West LLP (57) ABSTRACT

Disclosed are a stretchable touchscreen, a method for manufacturing the same and a display device including the same. After using a material having a high elastic restoring force as a substrate and determining regions where touch electrodes are formed by defining grooves thereon, touch electrodes are formed by filling the grooves with nanowires. Accordingly, it is possible to maintain elastic restoring force of the substrate and electrical connection between wires of nanowires, so that the touch electrode neither breaks nor factures despite being stretched any direction, and reliable stretchable touchscreens can be provided due to no resistance increase.

13 Claims, 8 Drawing Sheets

(51) Int. Cl.
*H05K 3/00* (2006.01)
*G06F 3/047* (2006.01)
*H05K 3/28* (2006.01)
*H05K 1/02* (2006.01)
*H05K 3/10* (2006.01)

(52) U.S. Cl.
CPC .............. *H05K 2201/0195* (2013.01); *H05K 2201/026* (2013.01); *H05K 2201/09036* (2013.01)

(56) References Cited

U.S. PATENT DOCUMENTS

| | | | |
|---|---|---|---|
| 9,911,029 | B2 | 3/2018 | Ebihara et al. |
| 9,933,886 | B2 | 4/2018 | Kim et al. |
| 9,952,723 | B2 | 4/2018 | Park et al. |
| 10,120,229 | B2 | 11/2018 | Chai et al. |
| 10,353,524 | B2 | 7/2019 | Park et al. |
| 10,438,715 | B2 | 10/2019 | Cho et al. |
| 2008/0143906 | A1* | 6/2008 | Allemand .............. B82Y 10/00 349/43 |
| 2010/0002402 | A1 | 1/2010 | Rogers et al. |
| 2010/0315373 | A1 | 12/2010 | Steinhauser et al. |
| 2012/0118066 | A1* | 5/2012 | Majidi .................. A61B 5/11 73/719 |
| 2012/0255762 | A1 | 10/2012 | Katagiri et al. |
| 2013/0000952 | A1* | 1/2013 | Srinivas ................. H01B 1/02 174/126.1 |
| 2013/0008754 | A1 | 1/2013 | Wilke et al. |
| 2013/0056244 | A1* | 3/2013 | Srinivas ................. G06F 3/041 174/250 |
| 2013/0293792 | A1 | 11/2013 | You et al. |
| 2014/0022467 | A1 | 1/2014 | Chai et al. |
| 2014/0144689 | A1 | 5/2014 | Yuan et al. |
| 2014/0149639 | A1* | 5/2014 | Sunkavalli ........... G11C 16/349 711/103 |
| 2014/0198266 | A1* | 7/2014 | Park ...................... G06F 3/044 349/12 |
| 2015/0008016 | A1* | 1/2015 | Poon .................... H05K 1/0274 174/253 |
| 2015/0062465 | A1 | 3/2015 | Her |
| 2015/0084907 | A1* | 3/2015 | Burberry ................ G06F 3/046 345/174 |
| 2015/0107881 | A1* | 4/2015 | Mori ..................... C03C 17/32 174/255 |
| 2015/0110953 | A1 | 4/2015 | You et al. |
| 2015/0145824 | A1 | 5/2015 | Park et al. |
| 2015/0346866 | A1* | 12/2015 | Kusunoki ............. G06F 3/044 345/174 |
| 2016/0125225 | A1 | 5/2016 | Ebihara et al. |
| 2016/0133349 | A1 | 5/2016 | Cho et al. |
| 2016/0152014 | A1 | 6/2016 | Matsumoto et al. |
| 2016/0202831 | A1 | 7/2016 | Kim et al. |
| 2016/0231098 | A1 | 8/2016 | Otaka et al. |
| 2016/0355705 | A1 | 12/2016 | Kawano et al. |
| 2018/0143477 | A1 | 5/2018 | Chai et al. |
| 2018/0196551 | A1 | 7/2018 | Park et al. |
| 2018/0225000 | A1 | 8/2018 | Kim et al. |
| 2019/0227647 | A1* | 7/2019 | Fang ..................... G06F 3/041 |
| 2019/0227650 | A1* | 7/2019 | Fang ..................... G06F 3/044 |

FOREIGN PATENT DOCUMENTS

| | | | |
|---|---|---|---|
| CN | 105590665 | A | 5/2016 |
| CN | 105929998 | A | 9/2016 |
| CN | 105955530 | A | 9/2016 |
| JP | 2010-182137 | A | 8/2010 |
| JP | 2011-501307 | A | 1/2011 |
| JP | 2011-149092 | A | 8/2011 |
| JP | 2014-503102 | A | 2/2014 |
| JP | 2014-505942 | A | 3/2014 |
| JP | 2015-045623 | A | 3/2015 |
| JP | 2015-046165 | A | 3/2015 |
| JP | 2015-102978 | A | 6/2015 |
| JP | 2015-103254 | A | 6/2015 |
| JP | 2015-518214 | A | 6/2015 |
| JP | 2015-179498 | A | 10/2015 |
| JP | 2015-215882 | A | 12/2015 |
| JP | 2016-129017 | A | 7/2016 |
| TW | 201511043 | A | 3/2015 |
| WO | WO 2012/096492 | A2 | 7/2012 |
| WO | WO 2012/099394 | A2 | 7/2012 |
| WO | WO 2014/153902 | A1 | 10/2014 |
| WO | WO 2014/207989 | A1 | 12/2014 |
| WO | WO 2015/019533 | A1 | 2/2015 |
| WO | WO 2016/084345 | A1 | 6/2016 |

OTHER PUBLICATIONS

Taiwan Intellectual Property Office, Office Action, TW Patent Application No. 106146570, dated Nov. 15, 2018, nine pages.
Japan Patent Office, Office Action, JP Patent Application No. 2019-162074, dated Oct. 27, 2020, nine pages.
China National Intellectual Property Administration, Office Action, CN Patent Application No. 201711474487.7, dated Aug. 4, 2020, 18 pages.
Japan Patent Office, Office Action, JP Patent Application No. 2019-162074, dated Aug. 3, 2021, five pages.

* cited by examiner

STRETCHABLE TOUCHSCREEN, METHOD FOR MANUFACTURING THE SAME, AND DISPLAY DEVICE USING THE SAME

This application claims the benefit of Korean Patent Application No. 10-2016-0184419, filed on Dec. 30, 2016, which is hereby incorporated by reference as if fully set forth herein.

BACKGROUND OF THE INVENTION

Field of the Invention

The present invention relates to a touchscreen. More specifically, the present invention relates to a stretchable touchscreen having reliable operation upon random elongation, a method for manufacturing the same and a display device including the same.

Discussion of the Related Art

Representative examples of display devices include liquid crystal displays (LCDs), organic light emitting diodes (OLEDs), plasma display panels (PDPs), quantum dot displays, field emission displays (FEDs), electrophoretic displays (EPDs) and the like. All of these displays include a flat display panel to display an image as an indispensable component and the flat display panel has a configuration in which a pair of transparent insulation substrates are joined via an inherent light-emitting, polarizing or other optical material layer such that the substrates face each other.

Among the display devices, organic light emitting diode displays have drawn a great deal of attention, because they can reduce weight through omission of a light source, and represent a variety of colors.

In addition, in accordance with an increased size of recent display devices, demand for configurations capable of reducing the occupied area is also increasing. Such demand accelerates the need for flexible display devices.

Accordingly, as the thickness of display devices gradually decreases, flexible display devices are being developed and need to be modified into a variety of forms. For example, these display devices include from bendable or rollable display devices to stretchable display devices which can be stretched in any direction.

Meanwhile, a display device needs to further include a touchscreen with a simple display function as well as an added touch detection function to meet specific user demands.

Touchscreens known to date utilize a transparent electrode as a touch electrode. However, the transparent electrode is generally hard and vulnerable to impact. For this reason, when such touchscreens are applied to flexible display devices, touch electrodes may be broken or fractured by a certain stress, causing an increase in resistance or, in serious cases, failure to detect touch. In particular, the touch electrodes are disposed lengthwise in a transmission or reception direction such that they are electrically connected to one another, or are disposed to be divided into predetermined patterns which need to be connected to one another. In the former case, stretchable display devices, implemented with the touchscreen, which receive lengthwise stress caused by elongation in one direction, may readily crack. In the latter case, isolation or cracking occurs in the connection part between electrodes. For this reason, the touch screens of the related art has a structure inapplicable to stretchable display devices because electrical connection is readily cut off.

Accordingly, research is underway on touchscreens which have excellent reliability even in a variety of flexible display devices.

SUMMARY OF THE INVENTION

Accordingly, the present invention is directed to a stretchable touchscreen, a method for manufacturing the same and a display device using the same that substantially obviate one or more problems due to limitations and disadvantages of the related art.

An object of the present invention is to provide a stretchable touchscreen and a display device including the same which can easily return to an original state after random elongation and exhibit reliability of electrodes in an elongated state by changing materials for the substrate and electrodes constituting the touchscreen as well as the formation method thereof, and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a stretchable touchscreen includes a substrate having a modulus of 100 MPa to 200 MPa, a plurality of first grooves arranged in a first direction on a first surface of the substrate with a first predetermined depth from the first surface of the substrate, a plurality of first electrodes including nanowires filling the first grooves, and a protective film covering the first electrode.

The substrate may be a silicone-based film or a polyurethane-based film.

The first grooves may be parallel to each other and may be disposed along the direction of one side of the substrate.

In addition, the protective film may be an organic film for planarizing a surface.

In addition, the stretchable touchscreen may further include a plurality of second electrodes disposed in a second direction crossing the first electrodes in the first direction on the protective film, and a plurality of first connection electrodes disposed in the first direction and connecting adjacent ones of the first electrodes, the first connection electrodes not overlapping the second electrodes and disposed in the first direction. The second electrodes and the first connection electrodes also include nanowires.

The protective film may include a laminate of an organic film and an inorganic film.

In addition, the stretchable touchscreen may further include a barrier film covering the second electrodes and the first connection electrodes on the protective film.

The stretchable touchscreen may further include a plurality of second grooves on a second surface of the substrate with a second predetermined depth from the second surface of the substrate, the second surface of the substrate opposite the first surface of the substrate, the first grooves arranged in the first direction and the second grooves arranged in a second direction crossing the first direction; and a plurality of second electrodes which fill the second grooves and include nanowires.

In accordance with another aspect of the present invention, provided is a method for manufacturing a stretchable touchscreen including forming a plurality of first grooves in a first direction with a first depth from a first surface of a substrate, the substrate having a modulus of 100 MPa to 200 MPa, filling the first grooves with nanowires to provide first electrodes, and forming a protective film covering the first electrodes and the first surface of the substrate.

The forming the first grooves may be carried out by injection-molding the substrate.

The method may further include selectively removing the protective film to form contact holes exposing both ends of the first electrodes, coating the protective film with nanowires while filling the contact holes, and selectively removing the nanowires to form, on the protective film, a plurality of first connection electrodes connected to both ends of adjacent ones of the first electrodes through the contact holes, and a plurality of second electrodes in a second direction crossing the first direction.

In this case, the method may further include forming a barrier film covering the protective film including the first connection electrodes and the second electrodes.

The method may further include forming a plurality of second grooves with a second depth from a second surface of the substrate and extending in a second direction crossing the first direction, and forming a plurality of second electrodes with nanowires in the second grooves.

The first grooves and the second grooves of the substrate may be defined by the injection molding process.

In another aspect of the present invention, provided is a display device including the stretchable touchscreen described above, and a display panel bonded to the stretchable touchscreen through an adhesive layer.

In another embodiment, a stretchable touchscreen comprises a flexible substrate having a modulus of 100 MPa to 200 MPa; and a plurality of first touch electrodes arranged in a first direction within the substrate with a first predetermined depth from the first surface of the substrate, the first electrodes including nanowires.

In some embodiments, the stretchable touchscreen may further comprise an organic protective film covering the flexible substrate and the first touch electrodes.

In some embodiments, the stretchable touchscreen may further comprise a plurality of second electrodes disposed in a second direction crossing the first electrodes; and a plurality of first connection electrodes disposed in in the first direction and connecting adjacent ones of the first electrodes, the first connection electrodes not overlapping the second electrodes and disposed in the first direction. The second electrodes and the first connection electrodes also include nanowires.

In some embodiments, the stretchable touchscreen may further comprise a plurality of second touch electrodes arranged in a second direction crossing the first direction and within the substrate with a second predetermined depth from a second surface of the substrate opposite the first surface of the substrate, the second electrodes also including nanowires.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

The advantages, features and methods of achieving the same of the present invention will be more clearly understood from the following detailed description taken in conjunction with the accompanying drawings. However, the present invention is not limited to a variety of embodiments described below and can be implemented in various forms. The embodiments of the present invention are provided only to completely disclose the present invention and fully inform a person having ordinary knowledge in the field to which the present invention pertains of the scope of the present invention. Accordingly, the present invention is defined by the scope of the claims.

The shape, size, ratio, angle, number and the like shown in the drawings to illustrate the embodiments of the present invention are only for illustration and are not limited to the contents shown in the drawings. Wherever possible, the same reference numbers will be used throughout the drawings to refer to the same or like parts. In the following description, detailed descriptions of technologies or configurations related to the present invention may be omitted so as not to unnecessarily obscure the subject matter of the present invention. When terms such as "including", "having" and "comprising" are used throughout the specification, an additional component may be present, unless "only" is used. A component described in a singular form encompasses components in a plural form unless particularly stated otherwise.

It should be interpreted that the components included in the embodiment of the present invention include an error range, although there is no additional particular description.

In describing a variety of embodiments of the present invention, when terms for location relation such as "on", "above", "under" and "next to" are used, at least one intervening element may be present between two elements unless "right" or "direct" is used.

In describing a variety of embodiments of the present invention, when terms for temporal relation, such as "after", "subsequently", "next" and "before", a non-continuous case may be present, unless "right" or "direct" is used.

In describing a variety of embodiments of the present invention, terms such as "first" and "second" may be used to describe a variety of components, but these terms only aim to distinguish the same or similar components from one another. Accordingly, throughout the specification, a "first" component may be the same as a "second" component within the technical concept of the present invention, unless specifically mentioned otherwise.

The respective features of various embodiments according to the present invention can be partially or entirely joined or combined and technically variably related Or operated, and the embodiments can be implemented independently or in combination.

Hereinafter, a stretchable touchscreen, a method of manufacturing the same and a display device including the same according to the present invention will be described in detail with reference to the annexed drawings.

Figure 1:
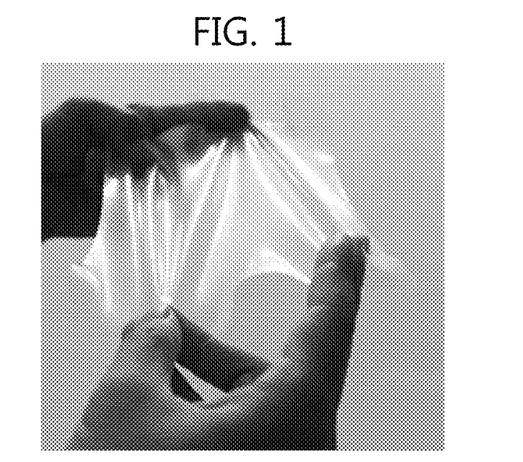
FIG. 1 is an image showing an example of a stretchable display device.

FIG. 1 is an image showing an example of a stretchable display device.

As shown in FIG. 1, the stretchable display device refers to a display device which can be elongated in a horizontal, vertical or diagonal direction of a material where display is realized and return to an original state after elongation. For example, a device which can be elongated freely like a thin film and can display images is referred to as a "stretchable display device".

The present invention relates to a stretchable display device shown in FIG. 1 supplemented with a touchscreen function, and more specifically, to a stretchable touchscreen. In order to prevent crack or breakage during elongation in the touch electrode formed by patterning a transparent electrode made of material such as ITO (indium tin oxide), the stretchable touchscreen according to embodiments herein has a configuration which is changed compared to the conventional touchscreens. The stretchable touchscreen according to the present invention can easily return to an original state without change in resistance of the touch electrode, regardless of the orientation or elongation of the electrode, thus solving the problem of a touch electrode of a conventional touchscreen.

Stretchable Touchscreen According to First Embodiment of the Present Invention

Figure 2:
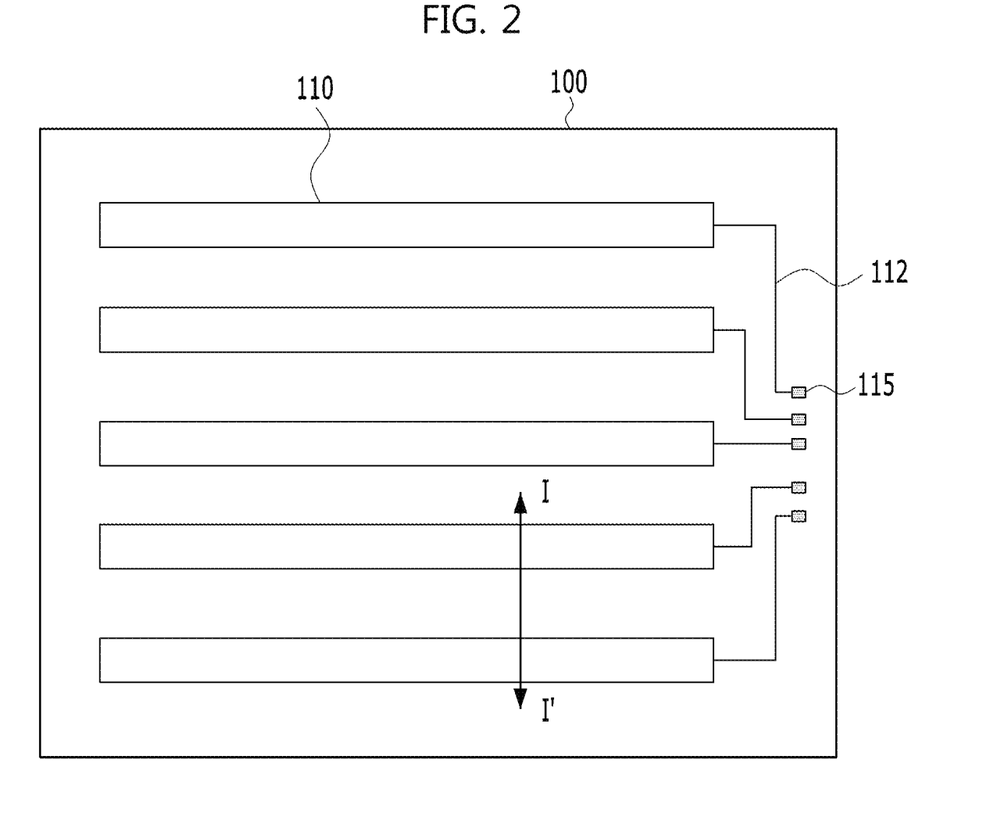
FIG. 2 is a plan view illustrating a stretchable touchscreen according to a first embodiment of the present invention.
Figure 3:
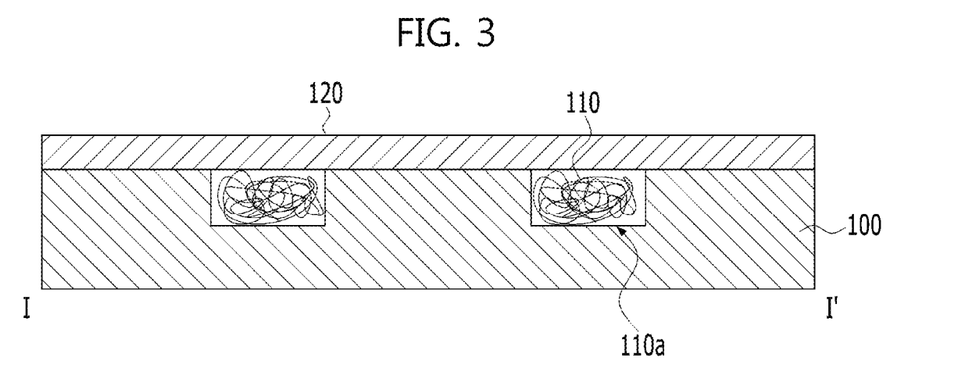
FIG. 3 is a sectional view taken along the line of I-I' of FIG. 2.

FIG. 2 is a plan view illustrating a stretchable touchscreen according to a first embodiment of the present invention and FIG. 3 is a sectional view taken along the line of I-I' of FIG. 2.

As shown in FIGS. 2 and 3, the stretchable touchscreen according to the first embodiment of the present invention includes: a substrate 100 having a modulus of 100 MPa to 200 MPa; a plurality of grooves 110a defined by removing a predetermined thickness from a first surface (an upper surface of the substrate in the drawing) of the substrate 100; a plurality of electrodes 110 including nanowires filling the grooves 110a; and a protective film 120 covering the electrodes 110.

Here, the substrate 100 may be a silicone-based film or a polyurethane-based film. However, the present invention is not limited to the aforementioned materials and any organic film material may be used without any restriction so long as it has a modulus of 100 to 200 MPa which is lower than the modulus of 4 to 10 GPa typical of plastic films such as PAC, PET, COP, PC or the like that can be used for touchscreens for flexible displays, can physically elongate in any direction and has elastic restoring force.

Modulus (also referred to as "elastic modulus") refers to a coefficient of elasticity upon elongation of a material. As modulus increases, elasticity decreases and, as modulus decreases, elasticity increases. Meanwhile, the modulus range of the substrate 100 according to the present invention is defined from 100 MPa to 200 MPa. The reason for this is that, in the case where the modulus is higher than 200 MPa, the material breaks or has difficulty of returning to an original state due to low elastic restoring force like general PET when the device is elongated to some extent. When the modulus is lower than 100 MPa, in the touch electrode array process of the stretchable touchscreen according to the present invention, the substrate loses supporting strength and the shape thereof changes.

In addition, the substrate 100 according to the present invention has a strain higher than 10%. Strain indicates an increase in area of a two-dimensional object. The substrate 100 according to the present invention can be elongated to 10% above the area of the original state. In this case, elongation is possible in a two-dimension scale, that is, in a plane, in any direction.

In addition, regarding the stretchable touchscreen according to the present invention, the electrodes 110 provided in the grooves 110a include nanowires made of a metal such as silver (Ag), gold (Au), copper (Cu), or molybdenum (Mo). Since the nanowires with a fine size of several nanometers are connected, the electrodes 110 can maintain their electrical connection state without breakage or fracture, thus maintaining reliability of the device, although the density of the inner structure increases or decreases upon elongation.

In addition, regarding the stretchable touchscreen according to the present invention, the reason for using a material having a certain modulus for the substrate 100 is to ensure stretchability of the substrate 100. In addition, the reason for previously preparing the grooves 110a to form electrodes 110 is to clearly distinguish patterns from one another in terms of the properties of nanowires. In addition, when the grooves 110a are defined in the substrate 100 and electrodes 110 made of nanowires are provided in the grooves 110a, the part to which elongation force is mainly applied is the substrate 100, and the force does not reach the electrodes 110 in the grooves 110a. As a result, stress applied to the electrodes 110 is reduced.

Meanwhile, the stretchable touchscreen according to the first embodiment of the present invention is operated in a self-capacitance manner. That is, the respective electrodes 110, which receive a signal, detect a signal change and, when the signal change is at a predetermined level or higher, it can be determined to be a touch. Accordingly, the electrodes 110 are disposed in parallel, in the same direction, for example, one direction such as an X or Y direction. In addition, the direction of the electrodes may follow the direction of one side of the substrate 100.

Meanwhile, the stretchable touchscreen may include a protective film 120 covering the electrodes 110 formed in the grooves 110a and the first surface of the substrate 100. This aims at preventing exposure of the electrodes 110 where electrical signal flows as well as planarizing the surface. For these two purposes, an organic film may be used as the protective film 120. In some cases, a barrier film including an inorganic film may be further provided on the organic film.

In addition, a routing line 112 having a thin line width is formed using the same metal as the nanowires of the electrodes 110 and a transparent electrode such as indium tin oxide (ITO) is patterned on the surface of the end of the routing line 112 which can be used as a pad electrode 115. In this case, the electrodes 110 and the routing line 112 can be simultaneously formed with nanowires because the nanowires have a nanometer-scale width ($10^{-9}$ m=0.001 μm) and the routing line having a width of several micrometers can be applied. Meanwhile, since the pad electrode 115 is provided only on one side of the substrate 100, elongation does not have a great influence on the pad electrode 115 although elongation force is applied to the substrate 100, unlike the central region of the substrate 100, thus causing no problem such as cracking.

Hereinafter, a method for manufacturing the stretchable touchscreen according to the first embodiment of the present invention will be described in detail.

Figure 4A:
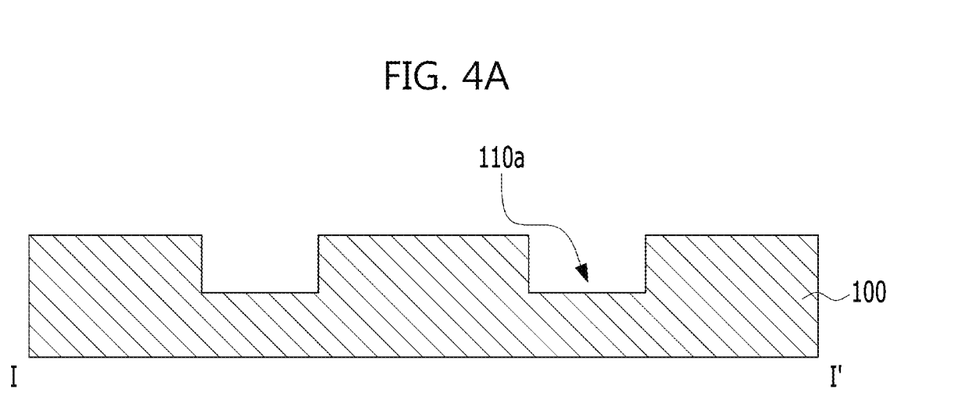
FIGS. 4A to 4C are sectional views illustrating a method of manufacturing the stretchable touchscreen according to the first embodiment of the present invention.
Figure 4B:
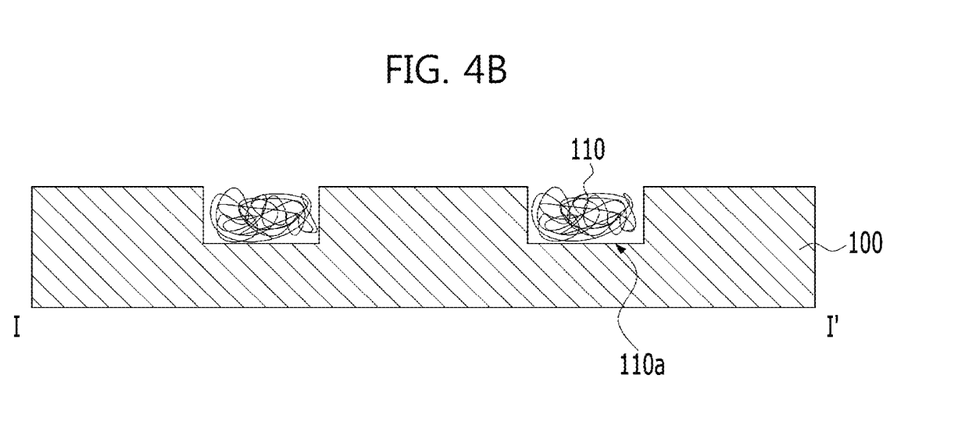
Figure 4C:
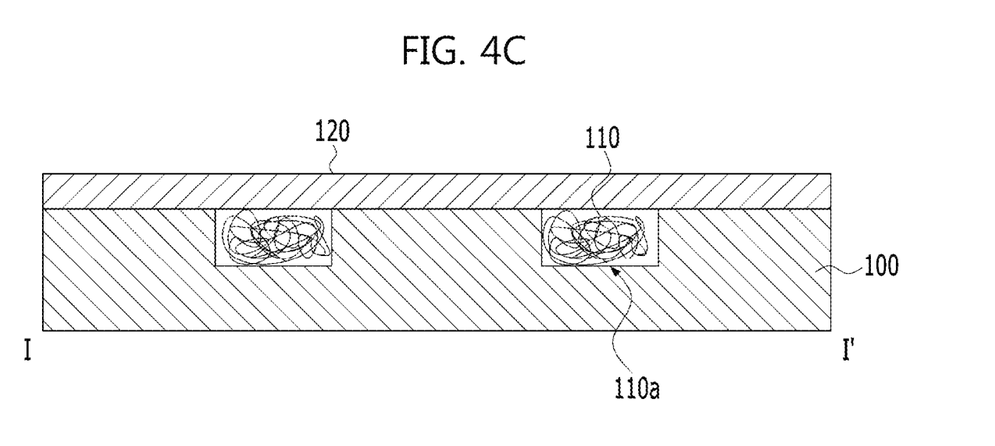

FIGS. 4A to 4C are sectional views illustrating a method of manufacturing the stretchable touchscreen according to the first embodiment of the present invention.

As shown in FIG. 4A, a substrate 100 having a modulus of 100 MPa to 200 MPa such as silicone elastomer or polyurethane is prepared and then a plurality of grooves 110a are formed in the substrate 100 in a row or column direction.

The grooves 100a are formed by injection molding so as to have a predetermined depth of 1 μm to 10 μm from the first surface (i.e., the top surface) of the substrate 100 when the substrate 100 has a thickness of about 100 μm to 200 μm.

Subsequently, as shown in FIG. 4B, a solvent containing nanowires is filled in the grooves 110a to form a plurality of electrodes 110 having the same shape as the grooves 110a. After formation of the electrodes 110, the liquid component of the solvent is volatilized. In this case, the liquid component of the solvent is for example DI water (deionized water).

Here, the grooves 110a previously define areas where electrodes 110 are formed, thereby solving the problem of difficulty in finely defining patterns during etching, since, like nanowires, wires are connected in the form of a chain.

Subsequently, as shown in FIG. 4C, the protective film 120 is formed on the surface of electrodes 110 filled in the grooves 110a and the first surface (i.e., the top surface) of the substrate 100, so as to protect the surface of the electrode of the stretchable touchscreen. The protective film 120 may be an organic film having a high dielectric constant and is formed to a thickness of several micrometers, thus functioning to planarize the surface and protect the electrodes 110. In addition, the protective film 120 may cover the electrodes 110 and the routing line 112, excluding the pad electrode 115.

The material for the substrate 100 has excellent elastic restoring force, which has a modulus of 100 MPa to 200 MPa. Accordingly, the material has an elongation proportion of 10% to 40% from the two-dimensional initial area which is applicable to stretchable devices. In addition, although the electrodes 110 included in the grooves 110a of the substrate 100 elongate to 20% of the initial state as well, the inner structure of nanowires has a lower density, but maintains its electrical connection state and leads to a change of resistance less than 10% from the initial resistance state. This means that the stretchable display device can maintain electrical reliability even upon reception of harsh stress by elongation.

Figure 5:
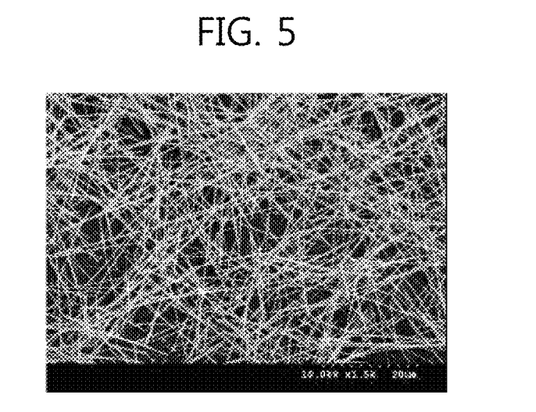
FIG. 5 is an enlarged view illustrating the structure of nanowires constituting the touch electrode of FIG. 2.

FIG. 5 is an enlarged view illustrating the structure of nanowires constituting the touch electrode of FIG. 2.

As shown in FIG. 5, the nanowires constituting the electrode 110 has an inner structure in which nano-scaled fine wires are entangled together and electrically connected, so that, although the gap between wires entangled is increased or decreased by elongation, electrical connection can be maintained, there is almost no change in resistance and electrical reliability despite elongation of the stretchable touchscreen can be thus ensured.

Stretchable Touchscreen According to Second Embodiment of the Present Invention

Figure 6:
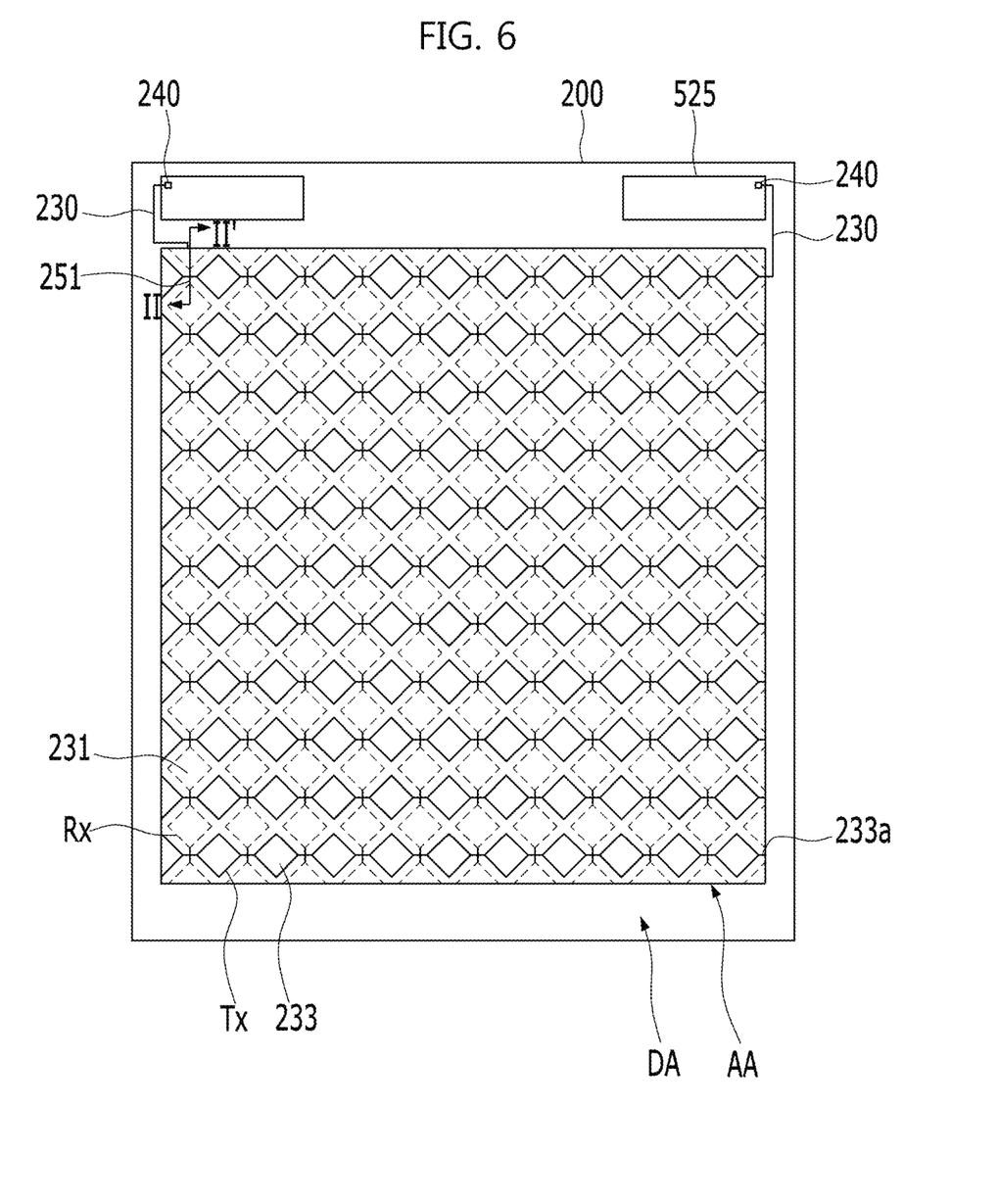
FIG. 6 is a plan view illustrating a stretchable touchscreen according to a second embodiment of the present invention.
Figure 7:
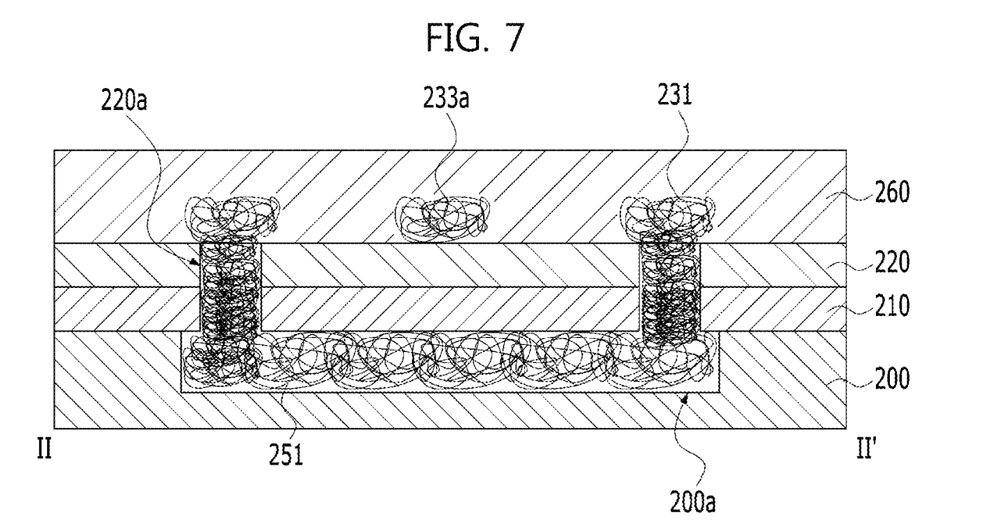
FIG. 7 is a sectional view taken along the line of II-II' of FIG. 6.

FIG. 6 is a plan view illustrating a stretchable touchscreen according to a second embodiment of the present invention and FIG. 7 is a sectional view taken along the line of II-II' of FIG. 6.

As shown in FIGS. 6 and 7, the stretchable touchscreen according to the second embodiment of the present invention is operated in a mutual capacitance manner and the stretchable touchscreen includes a plurality of Rx electrodes and a plurality of Tx electrodes that cross each other.

In the plan view shown in FIG. 6, the Rx electrodes and Tx electrodes are shown as diamond patterns continuously connected in one row or column. However, the present invention is not limited to the diamond patterns and other polygonal or circular patterns may replace the diamond patterns, if necessary.

In addition, as shown in FIG. 6, the Rx electrode has a structure in which first diamond patterns 231 spaced from one another in a vertical direction are connected by a bridge electrode 251 disposed in a different layer than the first diamond patterns 231 through a contact hole, and the Tx electrodes which cross the Rx electrodes include an integrated connection electrode 233a for connecting second diamond patterns 233 disposed in a horizontal direction. Here, the direction of the Rx electrodes may be opposite to that of the Tx electrodes. In addition, unlike what is shown in FIG. 6, the Rx electrodes may include diamond patterns disposed in a column direction and an integrated pattern disposed therebetween, while the Tx electrodes include diamond patterns disposed in a column direction and a bridge electrode disposed therebetween in a different layer than the Tx electrodes.

Regarding the stretchable touchscreen according to the present invention according to the second embodiment, as shown in FIG. 7, the Rx electrodes and the Tx electrodes, that is, all of the first diamond patterns 231, the second diamond patterns 233, the bridge electrode 251, and the connection electrode 233a include nanowires, and the bridge electrode 251 is disposed in grooves 200a of a substrate 200 having high elastic restoring force.

Here, a first interlayer insulating film 210 and a second interlayer insulating film 220 are provided between the bridge electrode 251 and the first diamond patterns 231, and contact holes 220a are provided through the first interlayer insulating film 210 and the second interlayer insulating film 220 at both ends of the bridge electrode 251. The first interlayer insulating film 210 is, for example, an insulation film including an organic film to stabilize the surface of the bridge electrode 251 provided in the lower layer, and the second interlayer insulating film 220 is a barrier film 220 including an organic film such as a nitride film to prevent moisture from permeating the organic film component. The barrier film 220 protects lower components against an etchant used to form the first diamond patterns 231 and the second diamond patterns 233 disposed thereon and the connection electrode 233a integrated with the second diamond patterns and prevents permeation of exterior air or moisture.

In addition, when forming the first diamond patterns 231 and the second diamond patterns 233, and the connection electrode 233a integrated with the second diamond patterns, the contact hole 220a is also filled with the nanowire metal connected to the first diamond patterns 231, thereby causing electrical connection to the bridge electrode 251.

In addition, the stretchable touchscreen according to the second embodiment of the present invention may include a protective film 260 which covers the first, second diamond patterns 231 and 233 and the connection electrode 233a as well.

Meanwhile, the component represented by reference numeral "240" refers to a pad electrode and the component represented by reference numeral 230 refers to a routing line. As described above, the pad electrode 240 may be formed with a line layer including a nanowire metal in a lower part and a transparent metal such as ITO in an upper part, and the routing line 230 is defined by a groove 200a having a smaller width than that of the diamond patterns 231 and 233, and a nanowire metal which is the same layer as the bridge electrode 251 in the groove 200a.

In addition, DA means a dead area and AA means an active area. The dead area DA is a region where sensing is not conducted and a pad part or lines applying a signal extend, and the active area AA means a region where actual touch is sensed by provided Rx and Tx electrodes.

Meanwhile, the reference numeral '525' refers to an anisotropic conductive film for bonding pad electrodes 240 to a display panel.

Hereinafter, the method for manufacturing the stretchable touchscreen according to the second embodiment of the present invention will be described.

FIGS. 8A to 8E are sectional views illustrating a method for manufacturing the stretchable touchscreen according to the second embodiment of the present invention.

Figure 8A:
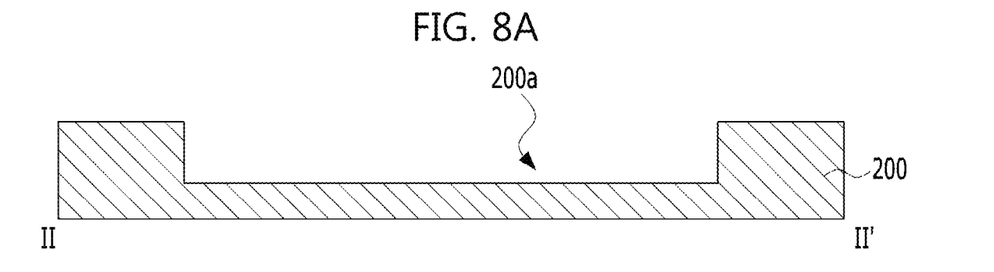
FIGS. 8A to 8E are sectional views illustrating a method for manufacturing the stretchable touchscreen according to the second embodiment of the present invention.

As shown in FIG. 8A, a plurality of first grooves 200a are formed to have a depth of about 1 μm to 10 μm from a first surface (i.e., top surface) of a substrate 200 having a modulus of 100 MPa to 200 MPa and spaced in one straight direction. Here, the substrate 200 has a thickness of 100 μm to 200 μm and the depth of the first grooves 200a is sufficiently small to maintain the elongation force of the substrate 200 even after formation of the first grooves 200a. The first grooves 200a may be defined by injection molding.

Figure 8B:
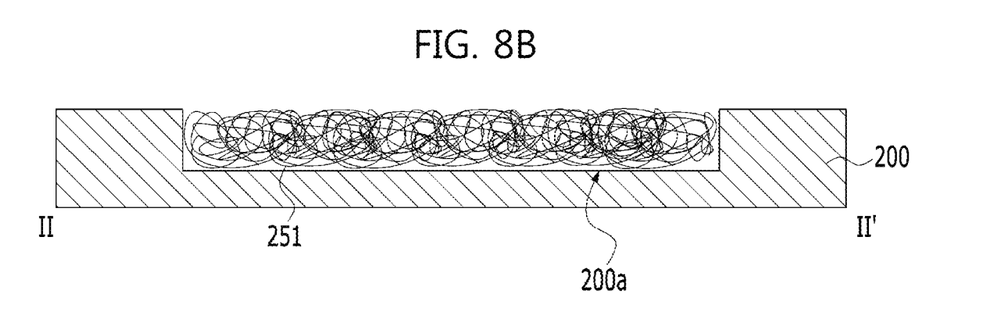

As shown in FIG. 8B, the first grooves 200a are filled with nanowires to form bridge electrodes 251.

Figure 8C:
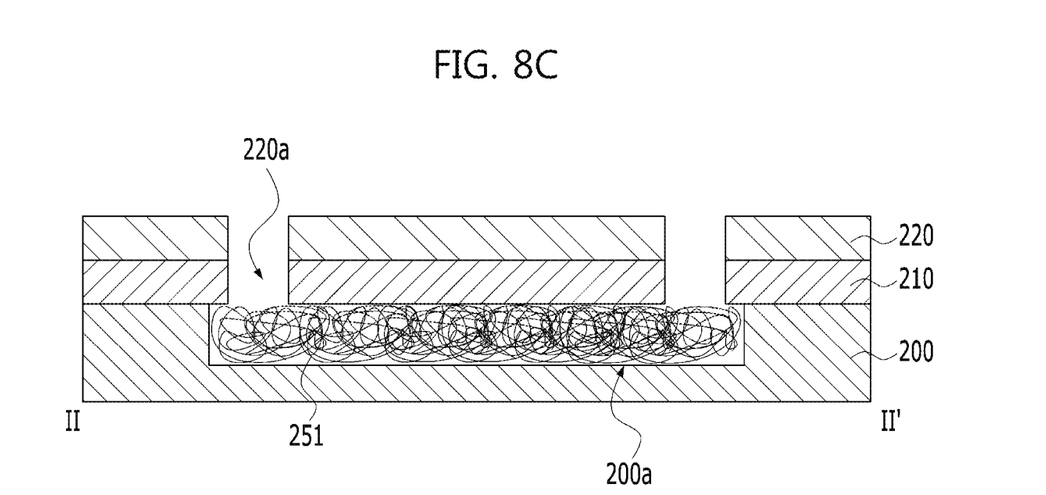

Subsequently, as shown in FIG. 8C, a first interlayer insulating film 210 including an organic film and a second interlayer insulating film 220 including an inorganic film are sequentially formed on a first surface (i.e., top surface) of the substrate 200 including the bridge electrodes 251.

Subsequently, both the second interlayer insulating film 220 and the first interlayer insulating film 210 are selectively etched to form contact holes 220a exposing both ends of the bridge electrodes 251.

Figure 8D:
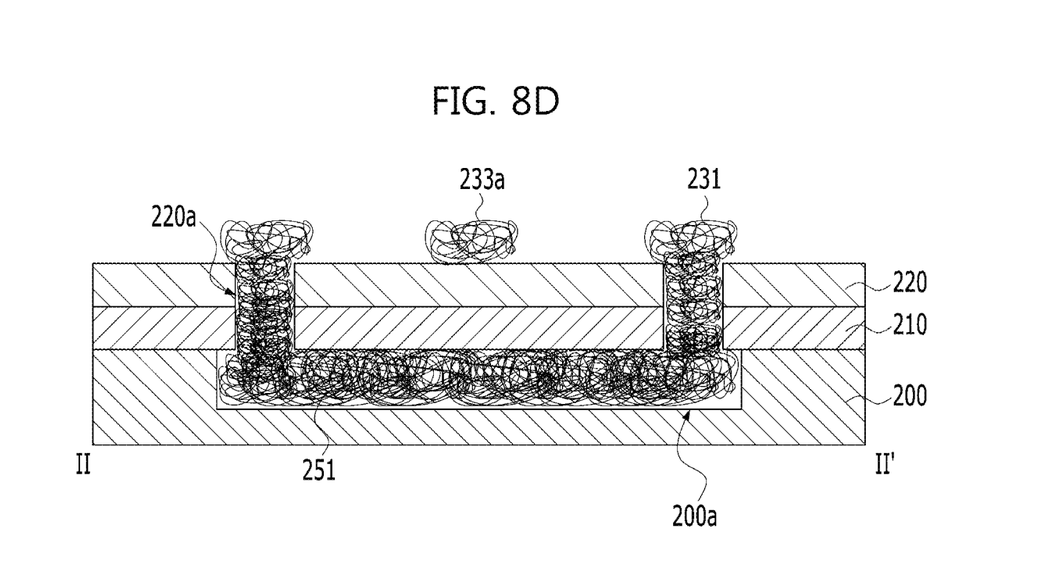

Subsequently, as shown in FIG. 8D, while filling the contact holes 220a with nanowires, the second interlayer insulating film 220 is also coated with nanowires and then selectively removed by etching to form, in areas excluding regions overlapping the bridge electrodes 251, first diamond patterns 231 and second diamond patterns 233 disposed in rows and columns (or columns and rows), respectively, which cross each other, and a connection electrode 233a connecting, in an integration type, the second diamond patterns 233 adjacent to one another.

Figure 8E:
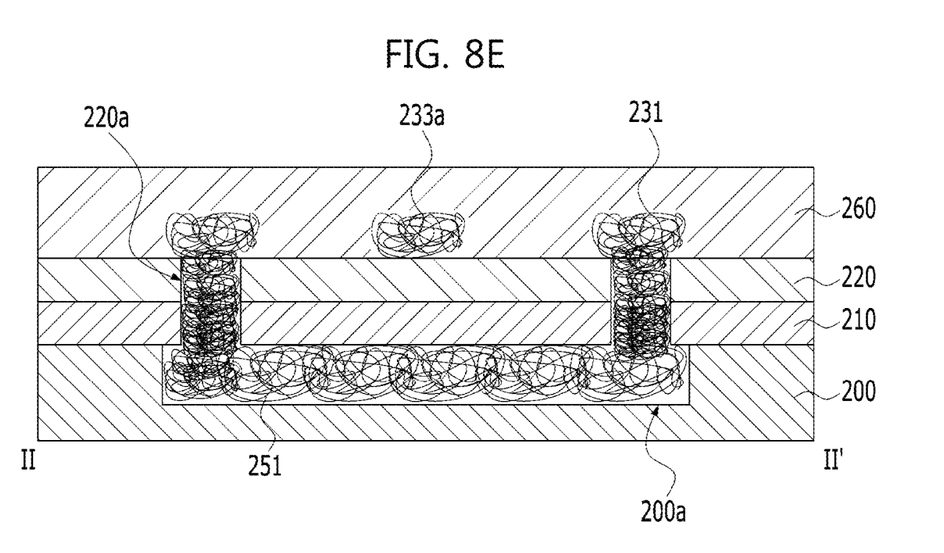

Subsequently, as shown in FIG. 8E, a protective film 260 including an inorganic film is formed such that it covers the first diamond patterns 231, the second diamond patterns 233 and the connection electrode 233a.

Meanwhile, in the case of the stretchable touchscreen according to the second embodiment, in terms of the function of the electrode, both the first diamond patterns 231 and the bridge electrode 251 are referred to as "first electrodes", and both the second diamond patterns 233 and the connection electrode 233a are referred to as "second electrodes".

In addition, the first diamond patterns 231, the second diamond patterns 233 and the connection electrode 233a exposed to the upper surface of the second interlayer insulating film 220 after etching are not patterned in the form of completely regular diamonds or regular polygons and these patterns are spaced by a distance of several micrometers although the wires protrude from the edge so that, the Rx and Tx electrodes crossing each other can maintain electrical isolation.

In addition, the stretchable touchscreen according to the present invention includes bridge electrodes 251 as first grooves 200a in the substrate 200 so that the same component of the bridge electrode 251 and first diamond patterns 231 are electrically connected, and the second diamond patterns 233 and the connection electrode 233a are electrically connected in a crossing direction and integrated in each direction. Accordingly, when the substrate 200 is elongated in a certain direction, electrodes of each direction receive less stress caused by elongation since nanowires are independently entangled. In addition, in terms of the structure of nanowires, although there is a part, density of which is decreased by elongation, electrical connection can be maintained and reliability of devices can be thus maintained upon touch.

Stretchable Touchscreen According to Third Embodiment of the Present Invention

Figure 9:
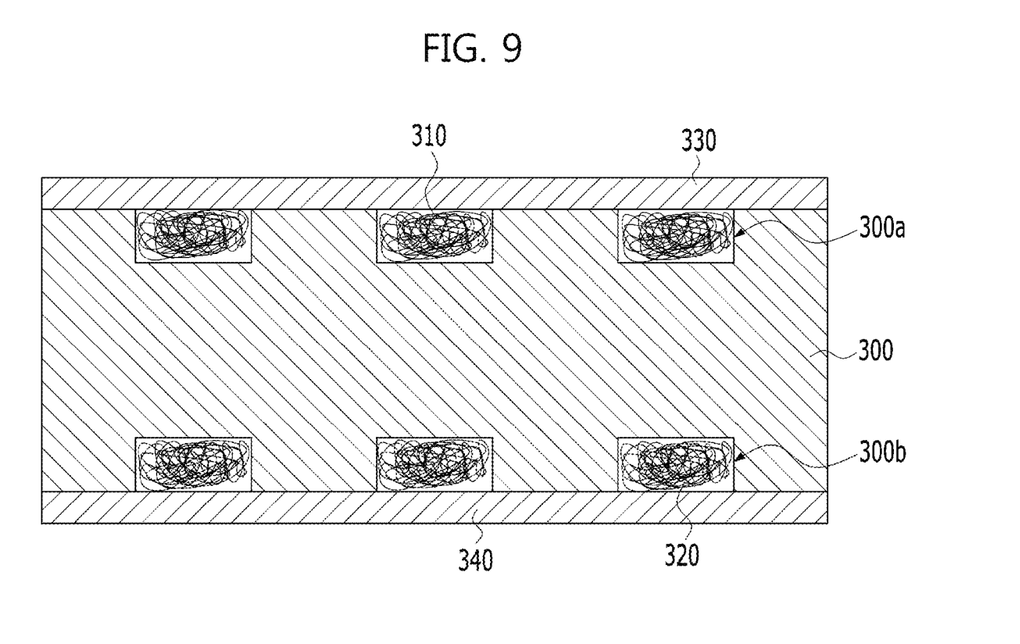
FIG. 9 is a sectional view illustrating a stretchable touchscreen according to a third embodiment of the present invention.

FIG. 9 is a sectional view illustrating a stretchable touchscreen according to a third embodiment of the present invention.

As shown in FIG. 9, the stretchable touchscreen according to the third embodiment of the present invention relates to another embodiment operated in a mutual capacitance manner. First electrodes 310 disposed in a first direction and second electrodes 320 disposed in a second direction crossing the first direction are provided on different surfaces (top surface and bottom surface) of a substrate 300.

In this case, first grooves 300a and second grooves 300b are injection-molded on a first surface and a second surface of the substrate 300 in the same process, and the first and second grooves 300a and 300b of the respective surfaces are filled with first electrodes 310 and second electrodes 320 including nanowires.

In addition, the first surface of the substrate 300 including the first electrodes 310 is covered with a first protective film 330 to protect the first surface and the second surface of the substrate 300 including the second electrode 320 is covered with a second protective film 340 to protect the second surface.

Here, the first and second protective films 330 and 340 may be transparent organic films and may further include a barrier film including an inorganic film thereon.

The stretchable touchscreen according to the third embodiment includes Rx and Tx electrodes which transfer different signals in separate formation areas of a single substrate 300, thereby efficiently patterning the electrodes including nanowires and operating in a mutual capacitance manner with almost no or low signal interference because additional etching of contact holes or nanowires is not needed.

Meanwhile, a display device using the stretchable touchscreen according to the present invention will be described.

Figure 10:
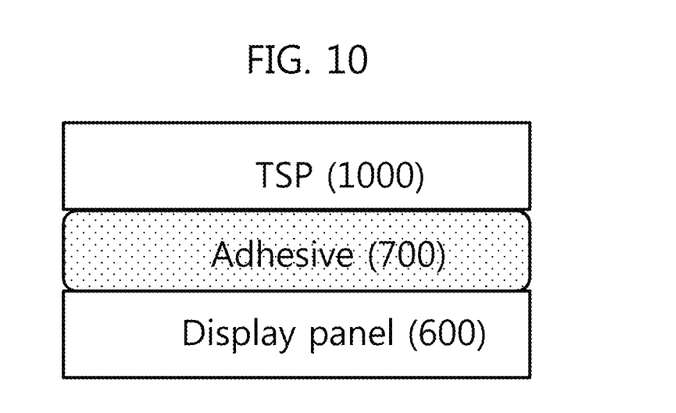
FIG. 10 is a sectional view illustrating a display device including the stretchable touchscreen according to the present invention.

FIG. 10 is a sectional view illustrating a display device including the stretchable touchscreen according to the present invention.

As shown in FIG. 10, the display device of the present invention includes the aforementioned stretchable touchscreen and the following display panel 600.

That is, the display panel 600 includes a plurality of sub-pixels in an active area and each sub-pixel includes at least one thin film transistor and an organic light emitting diode.

In order for the display panel 600 to meet requirements for flexible and stretchable display devices, a thin film transistor and an organic light emitting diode may be incorporated on a flexible substrate (not shown). In some cases, some configurations of the display panel 600 may utilize the grooves of the stretchable touchscreen and filling the grooves with electrodes including nanowires, as described above.

The stretchable touch panel 100 is adhered through an adhesive layer 700 to the display panel 600 and maintains stretchability.

Meanwhile, the stretchable touchscreen according to the present invention utilizes a material having a two-dimensional elongation of 10% to 40%, such as a silicone elastomer or polyurethane, which is suitable for stretchable devices and has almost no resistance change upon elongation, owing to the feature that electrodes have an irregular chain structure due to the nanowires, by filling injection-molded grooves with electrodes including nanowires, and thus maintain reliability of the operation in spite of repeated stretching.

In addition, since grooves are filled with nanowires, rather than being patterned, it is possible to prevent difference in sensibility between areas upon etching, solve the disadvantages of amorphous nanowires, and maintain a desired electrode shape.

The stretchable touchscreen, the method for manufacturing the same and the display device including the same according to the present invention have the following effects.

After using material having a high elastic restoring force as a substrate and determining regions where touch electrodes are formed by defining grooves thereon, touch electrodes are formed by filling the grooves with nanowires. Accordingly, it is possible to maintain the elastic restoring force of the substrate and electrical connection between wires of nanowires, so that the touch electrode neither breaks nor factures despite being stretched in any direction, and reliable stretchable touchscreens can be provided due to no increase in resistance.

In addition, a stretchable display device can be made by attaching such a touchscreen to a flexible display panel.

The features, configurations, effects and the like described in the embodiments described above are included in at least one embodiment of the present invention and the present invention is not necessarily limited to one embodiment. Furthermore, the features, configurations, effects and the like described in the embodiments described above could be combined or modified in conjunction with other embodiments by those skilled in the art. Accordingly, contents related to such combination and modification fall within the scope of the present invention.

In addition, it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents. For example, respective components specifically shown in the embodiments can be implemented in modified forms.

What is claimed is:

1. A stretchable touchscreen comprising:
   a stretchable substrate of a single layer having a modulus of 100 MPa to 200 MPa and a strain higher than 10%;
   a plurality of first grooves arranged in a first direction and defined by removing a first predetermined depth from a first surface of the stretchable substrate, wherein the first predetermined depth is from $\frac{1}{200}$ to $\frac{1}{10}$ of a thickness of the stretchable substrate;
   a plurality of first electrodes, each of the plurality of first electrodes including nanowires within each of the plurality of first grooves, wherein the nanowires connect each other in a form of a chain in each of the plurality of first grooves;
   gaps among the nanowires within each of the plurality of first grooves, wherein the gaps among the nanowires are changed by elongation of the stretchable substrate; and
   a protective film over the plurality of first electrodes,
   wherein an inner surface of the protective film is in coplanar contact with the first surface of the stretchable substrate and an upper surface of the nanowires included in each of the plurality of first electrodes.

2. The stretchable touchscreen according to claim 1, wherein the stretchable substrate is a silicone-based film or a polyurethane-based film.

3. The stretchable touchscreen according to claim 1, wherein the plurality of first grooves are parallel to each other and are disposed along the direction of one side of the stretchable substrate.

4. The stretchable touchscreen according to claim 1, wherein the protective film is an organic film for planarizing a surface.

5. The stretchable touchscreen according to claim 1, further comprising:
   a plurality of second electrodes disposed in a second direction crossing the first electrodes in the first direction on the protective film; and
   a plurality of first connection electrodes disposed in in the first direction and connecting adjacent ones of the first electrodes, the first connection electrodes not overlapping the second electrodes and disposed in the first direction,
   wherein the second electrodes and the first connection electrodes also include nanowires.

6. The stretchable touchscreen according to claim 5, wherein the protective film comprises a laminate of an organic film and an inorganic film.

7. The stretchable touchscreen according to claim 6, further comprising:

a barrier film covering the second electrodes and the first connection electrodes on the protective film.

8. The stretchable touchscreen according to claim 1, further comprising:
a plurality of second grooves on a second surface of the substrate with a second predetermined depth from the second surface of the substrate, the second surface of the substrate opposite the first surface of the substrate, the first grooves arranged in a first direction and the second grooves arranged in a second direction crossing the first direction; and
a plurality of second electrodes which fill the second grooves and include nanowires.

9. A display device comprising the stretchable touchscreen according to claim 1; and
a display panel bonded to the stretchable touchscreen through an adhesive layer.

10. The stretchable touchscreen of claim 1, further comprising a plurality of routing lines electrically connecting the first electrodes to corresponding pad electrodes, the routing lines made of same metals as the nanowires.

11. A stretchable touchscreen comprising:
a stretchable substrate having a modulus of 100 MPa to 200 MPa and a strain higher than 10%;
a plurality of grooves defined by removing constant first depth from the first surface of the stretchable substrate, the first depth is from $1/200$ to $1/10$ of a thickness of the stretchable substrate
a plurality of first bridge electrodes arranged in a first direction within the plurality of grooves of the stretchable substrate, and
a protecting film covering the plurality of first bridge electrodes,
a plurality of first touch electrodes arranged in the first direction and disposed on the protecting film;
a plurality of second touch electrodes arranged in a second direction crossing the first direction, the plurality of second touch electrodes being disposed on the protecting film;
a plurality of second bridge electrodes arranged in the second direction, the plurality of second bridge electrodes crossing the first bridge electrodes, and being electrically connected to the second touch electrodes, and not overlapping with the first touch electrodes, and
gaps among nanowires within each of the plurality of grooves, wherein the gaps among the nanowires are changed by elongation of the stretchable substrate;
wherein each of the plurality of grooves is disposed inside the stretchable substrate and has a first predetermined depth from a first surface of the stretchable substrate,
wherein each of the plurality of first bridge electrodes includes a first nanowire group filling each of the plurality of grooves, the first nanowire group has a plurality of nanowires connecting each other, each nanowires has a nanometer-scale width,
wherein the second bridge electrodes, the first touch electrodes and the second touch electrodes include a second nanowire group, the second nanowire group has a plurality of nanowires connecting each other, each nanowire has a nanometer-scale width,
wherein at least one of the plurality of nanowires positioned at an upper surface of each of the plurality of first bridge electrodes are coplanar with the first surface of the stretchable substrate, and
wherein the first depth is from $1/200$ to $1/10$ of the thickness of the stretchable substrate.

12. The stretchable touchscreen according to claim 11, further comprising an organic protective film covering both of the first surface of the stretchable substrate and the plurality of first bridge electrodes.

13. The stretchable touchscreen of claim 11, further comprising a plurality of first routing lines electrically connecting the first touch electrodes to corresponding pad electrodes, and a plurality of second routing lines electrically connecting the second touch electrodes to corresponding pad electrodes,
wherein the first routing lines and the second routing lines are formed of same metals as the nanowires.

* * * * *